United States Patent
Himeno et al.

(10) Patent No.: US 10,086,749 B2
(45) Date of Patent: Oct. 2, 2018

(54) VEHICLE FRONT LAMP

(71) Applicant: PANASONIC INTELLECTUAL PROPERTY MANAGEMENT CO., LTD., Osaka (JP)

(72) Inventors: Tohru Himeno, Osaka (JP); Naoko Takei, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/878,866

(22) Filed: Jan. 24, 2018

(65) Prior Publication Data
US 2018/0215308 A1 Aug. 2, 2018

(30) Foreign Application Priority Data
Jan. 30, 2017 (JP) .................................. 2017-014701

(51) Int. Cl.
| | | |
|---|---|---|
| *B60Q 1/02* | (2006.01) | |
| *B60Q 1/14* | (2006.01) | |
| *F21S 41/176* | (2018.01) | |

(52) U.S. Cl.
CPC .......... *B60Q 1/1415* (2013.01); *F21S 41/176* (2018.01)

(58) Field of Classification Search
None
See application file for complete search history.

(56) References Cited

U.S. PATENT DOCUMENTS

| | | | |
|---|---|---|---|
| 2011/0273897 A1 | 11/2011 | Kojima et al. | |
| 2013/0127341 A1* | 5/2013 | Langkabel | B60Q 1/085 315/79 |
| 2015/0264772 A1* | 9/2015 | Iwahashi | H05B 33/086 315/312 |

FOREIGN PATENT DOCUMENTS

| | | |
|---|---|---|
| JP | 2011-165341 | 8/2011 |
| JP | 2013-225401 | 10/2013 |
| JP | 2014-184876 | 10/2014 |

(Continued)

OTHER PUBLICATIONS

"Safety Standards for Road Transport Vehicles" (Jul. 7, 2008), Article 32, Headlamps, together with a partial English language translation.

(Continued)

*Primary Examiner* — Anh Tran
(74) *Attorney, Agent, or Firm* — Greenblum & Bernstein, P.L.C.

(57) ABSTRACT

Provided is a vehicle front lamp for use in a vehicle, including: a first white light source that emits first white light; a second white light source that emits second white light having a feeling of contrast index different from that of the first white light by at least 10; and a controller that controls light intensity of the first white light and light intensity of the second white light, in which chromaticity of the first white light and chromaticity of the second white light are each within a 5-step MacAdam ellipse, the first white light source and the second white light source are disposed in the vehicle front lamp so that the first white light and the second white light overlap each other on a certain illuminated surface, and the controller temporally changes a light intensity ratio between the first white light and the second white light.

8 Claims, 7 Drawing Sheets

| | L1 | L2 |
|---|---|---|
| x | 0.3461 | 0.3461 |
| y | 0.3548 | 0.3548 |
| FCI | 90 | 110 |

(56) References Cited

FOREIGN PATENT DOCUMENTS

JP    2014-222594    11/2014
JP    5668958    2/2015

OTHER PUBLICATIONS

"Handbook of Color Science", 3rd Edition, edited by the Color Science Association of Japan, University of Tokyo Press, Apr. 15, 2011, pp. 632-633, together with a partial English language translation.
The homepage of Japan Electric Engineers' Association together with a partial English language translation. (http://www.jeea.or.jp/course/contents/08302/) (2007) together paired with a partial English language translation.

* cited by examiner

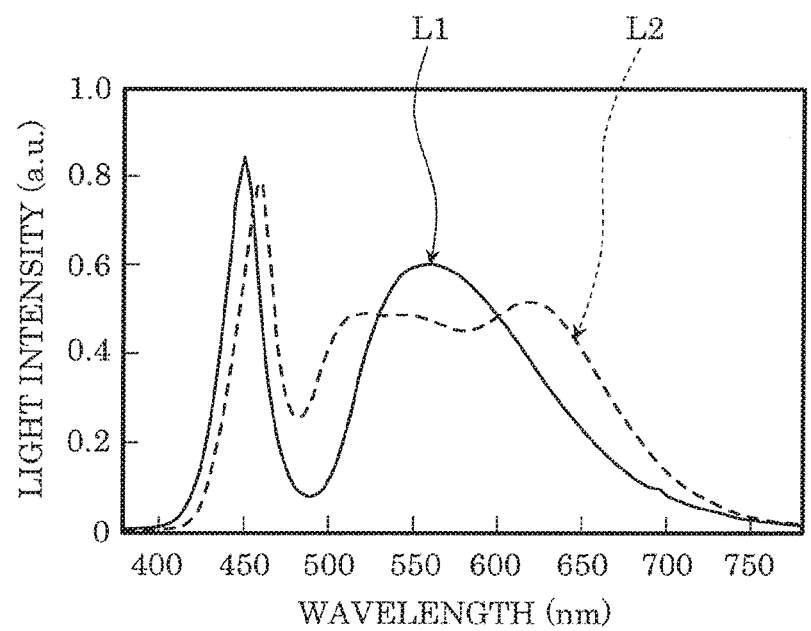

VEHICLE FRONT LAMP

CROSS REFERENCE TO RELATED APPLICATION

This application claims the benefit of priority of Japanese Patent Application Number 2017-014701 filed on Jan. 30, 2017, the entire content of which is hereby incorporated by reference.

BACKGROUND

1. Technical Field

The present disclosure relates to a vehicle front lamp.

2. Description of the Related Art

Increased brightness of a vehicle headlamp (vehicle front lamp) is desired so as to enable nighttime driving that is equivalent to daytime driving.

However, human visual sensitivity differs in each of photopic vision, scotopic vision, and mesopic vision. Photopic vision (vision in bright environments) allows color perception mediated by cone cells. In scotopic vision (vision in dark environments), cone cells are nonfunctional and thus color perception is not possible, but visual sensitivity is increased by rod cells. Moreover, mesopic vision (vision in low-light but not quite dark environments) is a combination of photopic vision and scotopic vision, and both cone cells and rod cells are functional.

Cone cells are predominantly found in the central region of the retina and extremely decrease in number with distance from the central region, while rod cells are absent in the central region of the retina and sharply increase in number with distance from the center. Accordingly, in mesopic environments, drivers of vehicles typically visually recognize the roadway regions of the road in central vision and visually recognize the sidewalk regions of the road in peripheral vision.

In view of this, a vehicle headlamp designed with the above described human visual sensitivity in mind has been proposed (for example, see Japanese Unexamined Patent Application Publication No. 2011-165341).

Japanese Unexamined Patent Application Publication No. 2011-165341 discloses a vehicle headlamp provided with a first light source for illuminating the direction of travel of the vehicle and a second light source for illuminating the outside of the region illuminated by the first light source. Moreover, the first light source emits light having color suitable for the visual sensitivity of cone cells, and the second light source emits light having color suitable for the visual sensitivity of rod cells.

With the vehicle front lamp according to the present disclosure, driver visibility can be improved in the central vision and in the peripheral vision.

SUMMARY

However, in such a conventional vehicle headlamp, for example, when driver's eyes shift between roadway region and sidewalk region, i.e. when a region seen in central vision is changed, the driver may have a strange feeling in color of illuminating light since each of the regions is illuminated by light having different color. Moreover, when the driver actually sees, in central vision, a region illuminated by light having color suitable for peripheral vision, it becomes difficult to visually recognize an illuminated object illuminated by this light.

In view of the foregoing, the present disclosure provides a vehicle front lamp that can suppress the strange feeling evoked by color of illuminating light and improve the visibility.

A vehicle front lamp according to one aspect of the present disclosure is for use in a vehicle and includes: a first white light source that emits first white light; a second white light source that emits second white light having a feeling of contrast index that is different from a feeling of contrast index of the first white light by at least 10; and a controller that controls light intensity of the first white light and light intensity of the second white light, in which chromaticity of the first white light and chromaticity of the second white light are each within a 5-step MacAdam ellipse, the first white light source and the second white light source are disposed in the vehicle front lamp so that the first white light and the second white light overlap each other on a certain illuminated surface, and the controller temporally changes a light intensity ratio between the first white light and the second white light.

With the vehicle front lamp according to the present disclosure, it is possible to suppress a strange feeling evoked by color of illuminating light and improve visibility.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 8 illustrates an exemplary emission spectrum of light from a vehicle front lamp according to an embodiment;

FIG. 9 illustrates the chromaticity and the FCI of white light from a white light source included in a vehicle front lamp according to an embodiment;

DETAILED DESCRIPTION OF THE EMBODIMENT

The following describes a vehicle front lamp according to an embodiment with reference to the drawings. Note that the embodiment described below shows a general or specific example of the present disclosure. The numerical values, shapes, materials, elements, the arrangement and connection of the elements, etc., indicated in the following embodiment are mere examples, and therefore do not intend to limit the present disclosure. Therefore, among elements in the following embodiment, those not recited in any of the independent claims defining the broadest inventive concept are described as optional elements.

It should be noted that the figures are schematic drawings, and are not necessarily exact depictions. In the figures, elements having essentially the same configuration share like reference numbers. Accordingly, overlapping descriptions thereof are omitted or simplified.

In the embodiment described below, "ahead" refers to the direction in which light is emitted from the vehicle front lamp (light emission direction). Moreover, "ahead" is the direction of travel when the vehicle equipped with the vehicle front lamp travels forward.

Moreover, in the embodiment described below, the Y axis extends vertically. The positive direction along the Y axis may be referred to as "upward" or "above", and the negative direction along the Y axis may be referred to as "downward" or "below". Moreover, the positive direction along the Z axis may be referred to as "forward". Moreover, the X axis and the Z axis are orthogonal to one another in a plane perpendicular to the Y axis (i.e., a horizontal plane).

Moreover, in the embodiment described below, the term "substantially" such as substantially constant is used. For example, substantially constant refers to not only completely constant but also nearly constant, i.e., there may be a difference of a few percent. The same definition is applied to other terms including "substantially".

Embodiment (Vehicle Front Lamp Configuration)

The vehicle front lamp according to the embodiment is described with reference to FIG. 1 to FIG. 3.

The vehicle front lamp according to the embodiment is installed in a vehicle to emit light in the direction of travel of the vehicle, and emits light onto the surface of the road or sign-posts on the road. The vehicle front lamp is used in, for example, an automobile, a motorcycle, or a bicycle.

Figure 1:
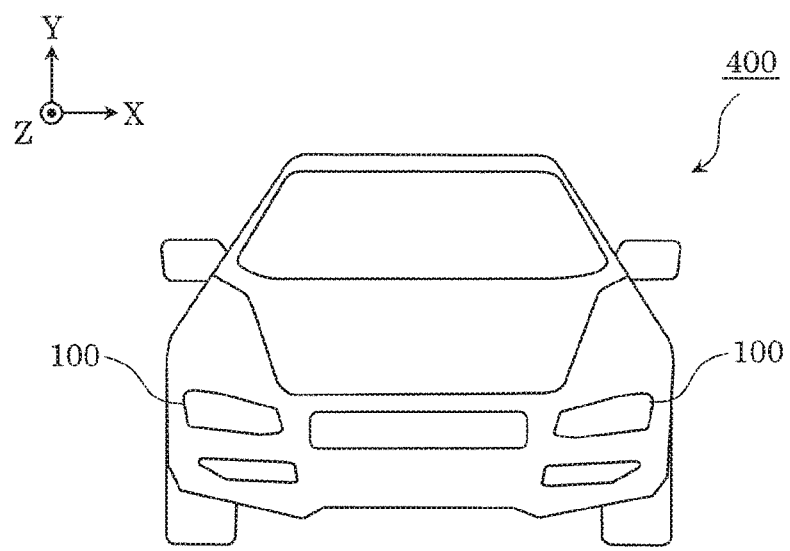
FIG. 1 illustrates a vehicle provided with a vehicle front lamp according to an embodiment.

FIG. 1 illustrates a vehicle provided with a vehicle front lamp according to the embodiment.

As illustrated in FIG. 1, vehicle 400 includes two vehicle front lamps 100 in the forward part of the vehicle (a region in the positive direction along the Z axis). In the present embodiment, vehicle 400 is a car. Vehicle front lamp 100 is an apparatus that emits light ahead of vehicle 400 to improve the visibility of a driver of vehicle 400.

Figure 2:
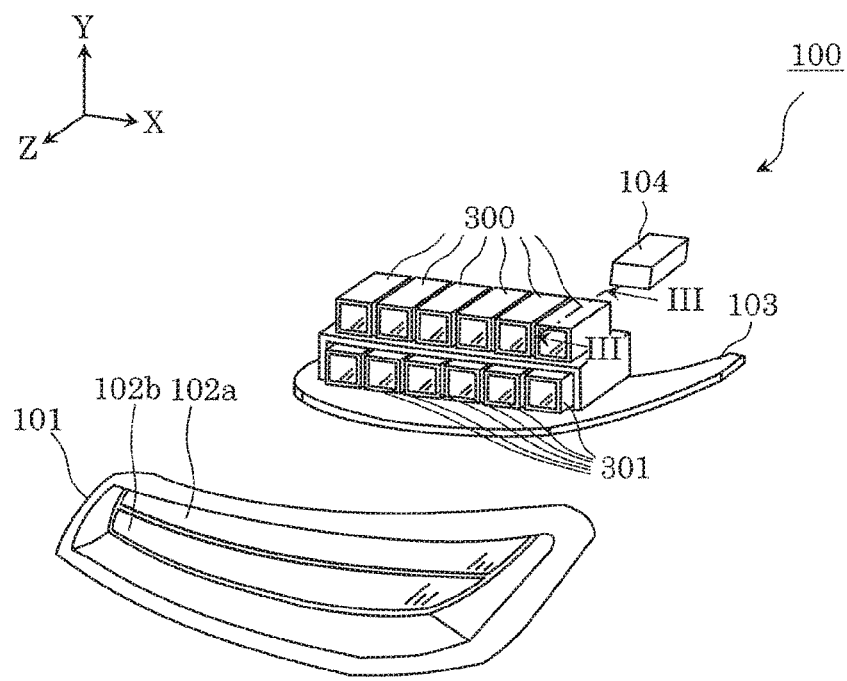
FIG. 2 is an exploded perspective view illustrating a vehicle front lamp according to an embodiment.

FIG. 2 is an exploded perspective view illustrating vehicle front lamp 100 according to the embodiment.

As illustrated in FIG. 2, vehicle front lamp 100 includes first light emitter 300, second light emitter 301, light-transmissive cover 101, base 103, and controller 104.

First light emitter 300 is a light-emitting apparatus that emits light far ahead of vehicle 400.

Figure 3:
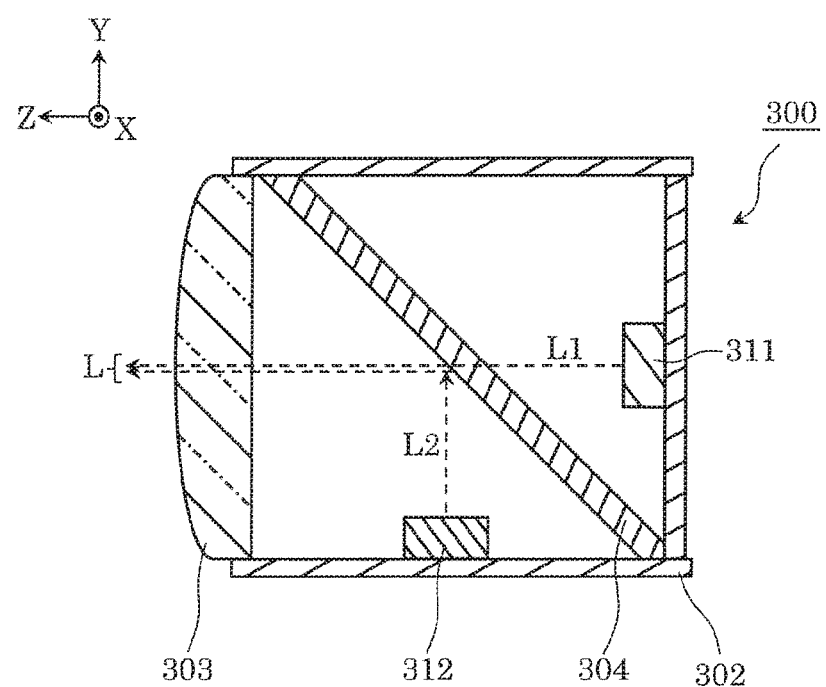
FIG. 3 is a cross sectional view illustrating a light emitter included in the vehicle front lamp according to the embodiment, taken at line III-III in FIG. 2.

FIG. 3 is a cross sectional view illustrating first light emitter 300 included in vehicle front lamp 100 according to the embodiment, taken at line III-III in FIG. 2.

As illustrated in FIG. 3, first light emitter 300 includes housing 302, lens 303, beam splitter 304, first white light source 311, and second white light source 312.

Housing 302 is a housing for housing first white light source 311 and second white light source 312, and holding lens 303 that transmits first white light L1 emitted by first white light source 311 and second white light L2 emitted by second white light source 312. The material of housing 302 is not limited to a particular material. For example, a metal material may be used.

First white light source 311 is a light source that emits first white light L1. One or more first white light sources 311 are provided in first light emitter 300. First white light source 311 includes, for example, a light-emitting element and a phosphor that converts the wavelength of a portion of the light from the light-emitting element.

Second white light source 312 is a light source that emits second white light L2. One or more second white light sources 312 are provided in first light emitter 300. Second white light source 312 includes, for example, a light-emitting element and a phosphor that converts the wavelength of a portion of the light from the light-emitting element.

First light emitter 300 emits illumination light L which is a combination with first white light L1 and second white light L2. Detailed configuration of first white light source 311 and second white light source 312 will be described later.

Moreover, chromaticity indicating color of first white light L1 and chromaticity indicating color of second white light L2 are each within a 5-step MacAdam ellipse on the xy chromaticity diagram of the CIE color system.

Here, the MacAdam ellipse is used for a quality control standard, which represents the region of colors perceived as the same color on the xy chromaticity diagram of the CIE color system, and it becomes more difficult for humans to distinguish colors as the number of steps decreases. As long as the chromaticity of light is within the 5-step MacAdam ellipse, humans perceive the light as almost the same color even though the light has different chromaticity. In other words, humans perceive the color of first white light L1 and the color of second white light L2 as almost the same color.

First white light source 311 and second white light source 312 are disposed in vehicle 400 (in the present embodiment, housing 302 included in first light emitter 300) so that first white light L1 and second white light L2 overlap each other on a certain illuminated surface illuminated by them. Here, the certain illuminated surface may be, for example, the surface of a screen provided vertically on a road at a position ahead of and away from vehicle 400 at a predetermined distance (for example, 25 m). For example, first white light source 311 and second white light source 312 are disposed in first light emitter 300 so that when the screen is illuminated by first white light L1 and second white light L2, first white light L1 and second white light L2 overlap each other on the illuminated surface of the screen. In the present embodiment, by using beam splitter 304, first white light L1 and second white light L2 are overlapped each other on a certain illuminated surface.

Beam splitter 304 is an optical component that splits light incident on beam splitter 304 into reflected light and transmitted light at a predetermined ratio. For example, beam splitter 304 transmits first white light L1 from first white light source 311, and reflects second white light L2 from second white light source 312. First light emitter 300 can emit illumination light L in which the optical axis of first white light L1 and the optical axis of second white light L2 are aligned, by adjusting the arrangement of first white light source 311, second white light source 312, and beam splitter 304. In other words, first white light L1 and second white light L2 can be overlapped each other on a certain illuminated surface by aligning the optical axis of first white light L1 and the optical axis of second white light L2.

Beam splitter 304 may be formed by stacking a multi-layered film on, for example, a glass material or a light-transmissive resin material such as acrylic or polycarbonate.

It should be noted that a method for overlapping first white light L1 and second white light L2 on a certain illuminated surface is not particularly limited. First white light L1 and second white light L2 may be overlapped each other on a certain illuminated surface by adjusting the arrangement of first white light source 311 and second white light source 312 without using beam splitter 304. Moreover, an optical component such as optical fiber or a light waveguide may be used to align the optical axis of first white light L1 and the optical axis of second white light L2.

Lens 303 is an optical component for controlling light distribution of first white light L1 and second white light L2 (i.e., illumination light L), and is held by housing 302. Lens 303 may be made of, for example, a glass material or a light-transmissive resin material such as acrylic or polycarbonate.

Second light emitter 301 is a light-emitting apparatus that emits white light downward ahead of vehicle 400. For example, second light emitter 301 emits white light downward ahead of vehicle 400. More specifically, in order to illuminate white lines 201 on road 200 (see FIG. 4), second light emitter 301 emits white light toward the surface of the road. Color (chromaticity) of white light from second light emitter 301 employs, for example, color (chromaticity) within the 5-step MacAdam ellipse for color (chromaticity) of illumination light L from first light emitter 300. For example, second light emitter 301 may include at least one of first white light source 311 and second white light source 312 included in first light emitter 300. With this, it is possible to reduce non-uniformity of color in the entire region illuminated by light from vehicle front lamp 100. Accordingly, for a driver, the light from vehicle front lamp 100 appears to naturally cover the entire space.

Light-transmissive cover 101 is a cover component that transmits light from first light emitter 300 and second light emitter 301. More specifically, light-transmissive cover 101 includes light-transmissive component 102a and light-transmissive component 102b.

Light-transmissive component 102a is an optical component that transmits illumination light L from first light emitter 300, and light-transmissive component 102b is an optical component that transmits white light from second light emitter 301. Light-transmissive component 102a and light-transmissive component 102b may be made of, for example, a glass material or a light-transmissive resin material such as acrylic or polycarbonate. It should be noted that in the present embodiment, light-transmissive component 102a and light-transmissive component 102b are configured as separate components, but may be configured as a single component.

Base 103 is a plate on which first light emitter 300 and second light emitter 301 are disposed. In the present embodiment, second light emitters 301 are disposed on base 103, and first light emitters 300 are placed on second light emitters 301.

Controller 104 is a control apparatus that controls the light intensity of first light emitter 300 and the light intensity of second light emitter 301. More specifically, controller 104 is a control apparatus that controls the light intensity of light emitted from a light source included in first light emitter 300 and the light intensity of light emitted from a light source included in second light emitter 301. Here, the light intensity refers to an optical output defined by, for example, luminous flux (unit: lm (lumen)) or luminous intensity (unit: cd (candela)) of light emitted from a light source.

Moreover, controller 104 temporally changes a light intensity ratio between first white light L1 and second white light L2. More specifically, controller 104 controls first white light source 311 and second white light source 312 so as to temporally and periodically change the light intensity ratio between first white light L1 and second white light L2 at predetermined cycles.

Moreover, controller 104 temporally changes the light intensity ratio between first white light L1 and second white light L2 so that a sum of the light intensity of first white light L1 and the light intensity of second white light L2 is substantially constant. Here, the term "light intensity is substantially constant" excludes, for example, a slight change in light intensity and a measurement error of light intensity which are caused by fluctuation of power injected into a light-emitting element due to a pulsing flow.

Moreover, controller 104 controls, for first white light L1 and second white light L2, the frequency of light intensity indicating a temporal change in light intensity so as to be a predetermined frequency. In other words, controller 104 controls the frequency of light intensity indicating a temporal change in light intensity of first white light L1 so as to be a predetermined frequency, and also controls the frequency of light intensity of second white light L2 so as to be a predetermined frequency. This predetermined frequency may be, for example, in a range from 1 Hz to 30 Hz inclusive. The frequency of the light intensity of first white light L1 and the frequency of the light intensity of second white light L2 are not particularly limited, and may be the same or different.

It should be noted that the detailed properties of first white light L1 and second white light L2 will be described later.

Controller 104 may be, for example, a processor implemented by a central processing unit (CPU) and a control program stored in a storage (not shown) such as a read only memory (ROM), a random access memory (RAM), a hard disk drive (HDD), and a flash memory. Controller 104 may be implemented as hardware by a dedicated electronic circuit using a gate array or the like.

It should be noted that controller 104 is electrically connected to first light emitter 300 and second light emitter 301 via a lead or the like not shown in the figures.

(Illumination Range of Illumination Light)

Next, the illumination range of light from vehicle front lamp 100 according to the present embodiment is described with reference to FIG. 4.

Figure 4:
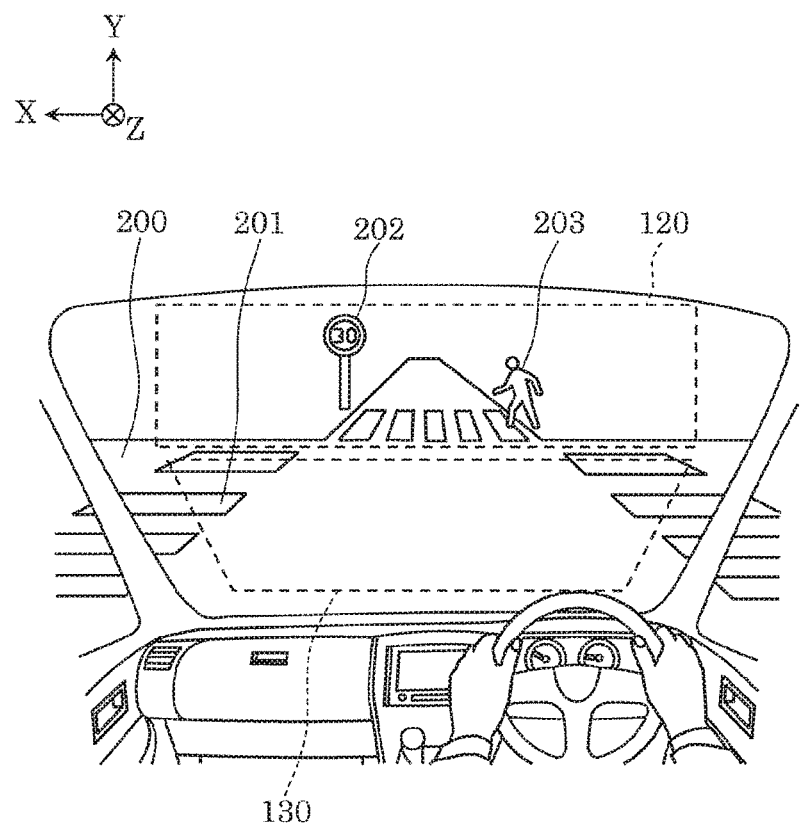
FIG. 4 is a schematic view illustrating the illumination range of light from a vehicle front lamp according to an embodiment.

FIG. 4 is a schematic view illustrating the illumination range of light from vehicle front lamp 100 according to the present embodiment. It should be noted that FIG. 4 schematically illustrates a view in the direction of travel (ahead) from inside vehicle 400 when being driven.

As illustrated in FIG. 4, second light emitter 301 included in vehicle front lamp 100 emits white light onto the surface of road 200 including roadway and sidewalk. More specifically, second light emitter 301 emits white light so as to illuminate second illumination region 130 which is downward ahead of (in the direction of travel of) vehicle 400 equipped with vehicle front lamp 100.

Moreover, first light emitter 300 included in vehicle front lamp 100 emits illumination light L to first illumination region 120 which is further vertically upward relative to road 200 than second illumination region 130. In other words, first light emitter 300 emits illumination light L far ahead of vehicle 400. Specifically, in order to illuminate, for example, sign-post 202 on road 200 and pedestrian 203, first light emitter 300 emits illumination light L to first illumination region (far ahead). More specifically, in order to illuminate chromatic objects such as sign-post 202 and pedestrian 203, first light emitter 300 emits illumination light L including first white light L1 and second white light L2 in a direction substantially parallel to the surface of road 200 and ahead of vehicle 400 when being driven.

It should be noted that first illumination region 120 and second illumination region 130 may partially overlap each other. It should be noted that first illumination region 120 and second illumination region 130 are not strictly distinguished from each other. For example, the dashed line defining first illumination region 120 surrounds a range extending to half the maximum light intensity in first illumination region 120. Moreover, for example, the dashed line defining second illumination region 130 surrounds a range extending to half the maximum light intensity in second illumination region 130.

(Configuration of White Light Source)

Next, detailed configurations of first white light source 311 and second white light source 312 are described with reference to FIG. 5 and FIG. 6. It should be noted that first white light source 311 and second white light source 312 may include essentially the same elements, it is sufficient so long as first white light L1 from first white light source 311 and second white light L2 from second white light source 312 each have the properties to be described later. Accordingly, in the following, a specific example in which first white light source 311 and second white light source 312 have the same configuration will be given as white light source 310.

Figure 5:
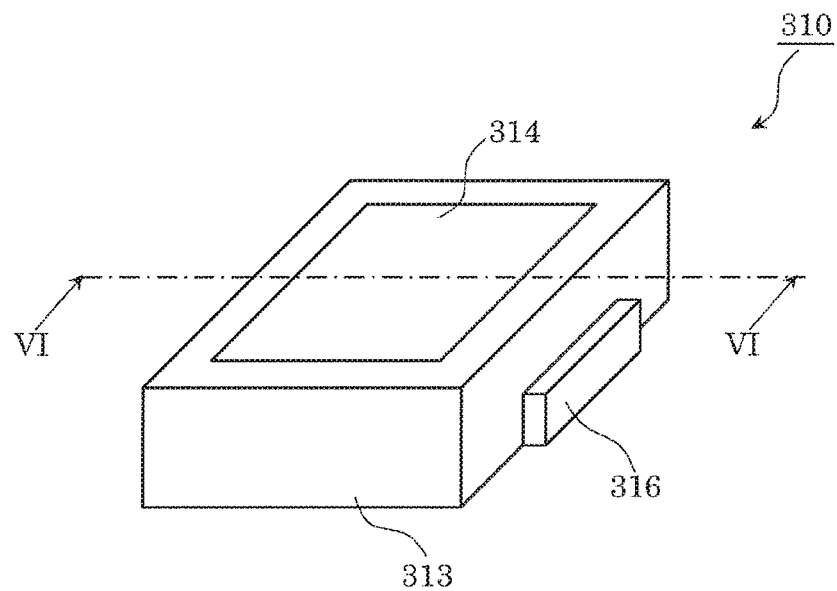
FIG. 5 is an external perspective view illustrating a white light source included in a vehicle front lamp according to an embodiment.

FIG. 5 is an external perspective view of white light source 310 included in vehicle front lamp 100 according to the present embodiment. FIG. 6 is a schematic cross sectional view of white light source 310 taken at line VI-VI in FIG. 5.

Figure 6:
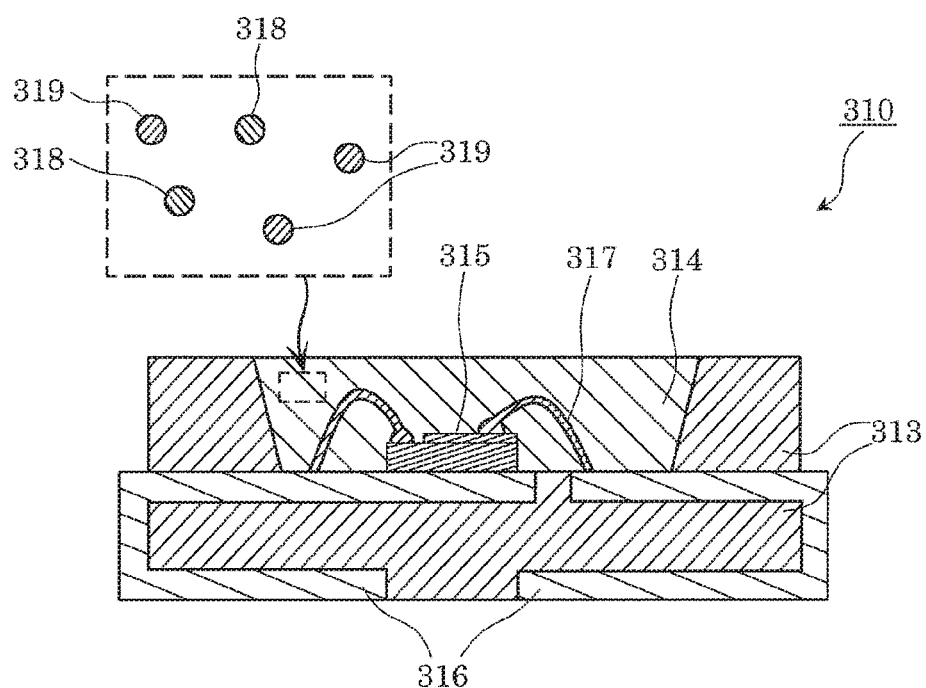
FIG. 6 is a cross sectional view illustrating the white light source taken at line VI-VI in FIG. 5.

As illustrated in FIG. 5 and FIG. 6, white light source 310 according to the present embodiment is implemented as a surface mount device (SMD) light-emitting device.

White light source 310 includes package 313 having a cavity, sealant 314 filling the cavity, and light-emitting diode (LED)) chip (light-emitting element) 315.

Package 313 is a container for housing LED chip 315 and sealant 314. Package 313 also includes electrode 316 which is a metal electrical line for supplying power to LED chip 315. LED chip 315 and electrode 316 are electrically connected via bonding wire 317. The material of package 313 is not particularly limited, and is, for example, a metal, ceramic or resin material. It should be noted that the inner surface of package 313 in which LED chip 315 is disposed may be treated so as to increase reflectivity.

LED chip 315 is an exemplary light-emitting element, and is a blue LED chip that emits blue light. LED chip 315 is made of, for example, indium gallium nitride (InGaN) materials.

Sealant 314 seals at least part of LED chip 315, electrode 316, and bonding wire 317. Sealant 314 includes a wavelength converter that converts the wavelength of a portion of the light from LED chip 315. More specifically, sealant 314 is made of a light-transmissive resin material including, as wavelength converters, green phosphor particles 318 and red phosphor particles 319. The light-transmissive resin material is not limited to a particular material. For example, a methyl based silicone resin, an epoxy resin, or a urea resin may be used.

Green phosphor particles 318 are exemplary phosphor particles, and are excited by the blue light from LED chip 315 and emit green light having a wavelength different from the wavelength of the blue light from LED chip 315. The material of green phosphor particles 318 is, for example, a $Ce^{3+}$-activated oxide phosphor such as a $Lu_3Al_5O_{12}:Ce^{3+}$ phosphor. Alternatively, for example, a yttrium aluminum garnet (YAG) phosphor may be used for green phosphor particles 318. Moreover, for example, a halosilicate phosphor may be used for green phosphor particles 318. Moreover, for example, an oxynitride phosphor may be used for green phosphor particles 318.

Red phosphor particles 319 are exemplary phosphor particles, and are excited by the blue light from LED chip 315 and emit red light having a wavelength different from the wavelength of the blue light from LED chip 315. The material of red phosphor particles 319 is not limited to a particular material. For example, a (Sr, Ca) $AlSiN_3:Eu^{2+}$ phosphor may be used.

With the above configuration, a portion of the blue light from LED chip 315 is wavelength-converted into green light by green phosphor particles 318 included in sealant 314. Similarly, a portion of the blue light from LED chip 315 is wavelength-converted into red light by red phosphor particles 319 included in sealant 314. Then, the blue light not absorbed by green phosphor particles 318 and red phosphor particles 319, the green light wavelength-converted by green phosphor particles 318, and the red light wavelength-converted by red phosphor particles 319 diffuse and mix in sealant 314. This results in white light being emitted from sealant 314. In other words, white light source 310 emits white light as a result of mixing of the light from LED chip 315, the light from green phosphor particles 318, and the light from green phosphor particles 318.

(Details Regarding Illumination Light)

Next, a specific example of illumination light L from first light emitter 300 is described with reference to FIG. 7 to FIG. 11.

The white color range for light from a vehicle front lamp is specified in Article 32, Headlamps, of the Japanese safety standards for road transport vehicles, and shown in the xy chromaticity diagram of the Commission Internationale de l'Eclairage (CIE) color system. In the present specification, white color is regarded as the specified white color.

Figure 7:
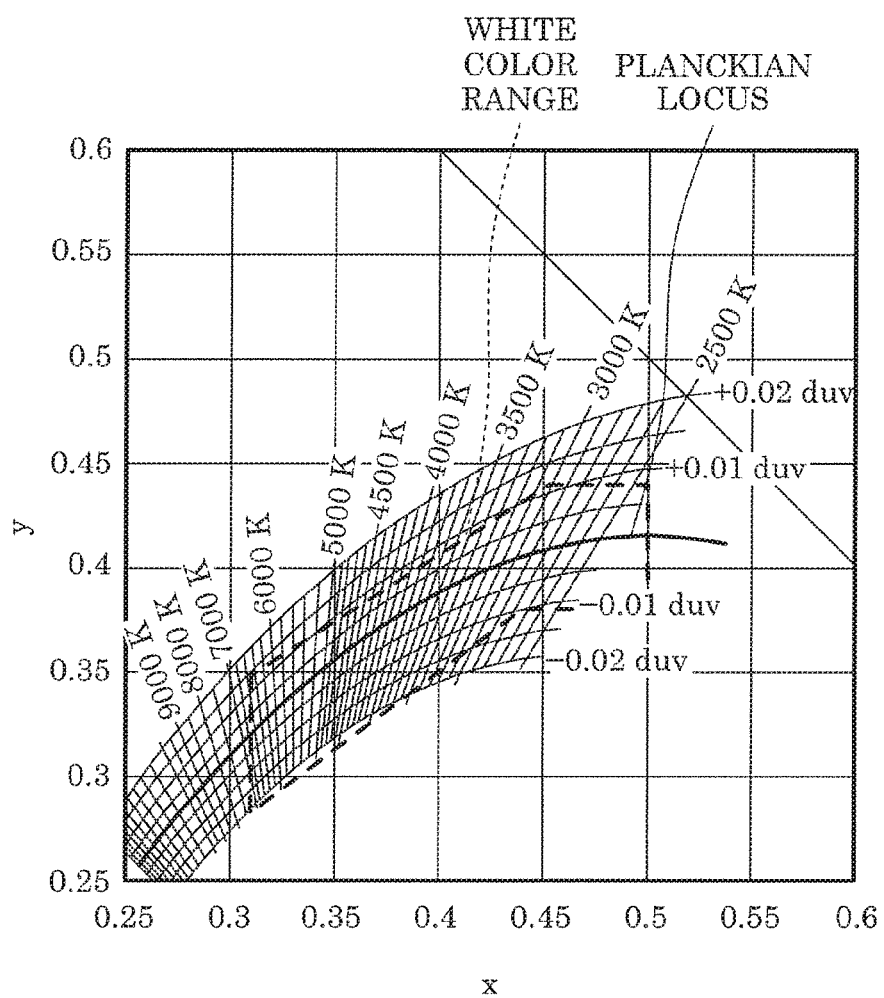
FIG. 7 illustrates a white color range of light from a vehicle front lamp according to an embodiment.

FIG. 7 illustrates a white color range for white light from vehicle front lamp 100 according to the embodiment. More specifically, FIG. 7 is the xy chromaticity diagram of the CIE color system.

As illustrated in FIG. 7, white color has chromaticity within the region surrounded by the dashed line. In other words, white light refers to light having chromaticity within the region surrounded by the dashed line in FIG. 7.

FIG. 8 illustrates an exemplary emission spectrum of white light from vehicle front lamp 100 according to the embodiment. More specifically, FIG. 8 illustrate a specific example of the emission spectra of first white light L1 and second white light L2.

First white light source 311 and second white light source 312 that emit light having their respective emission spectra as illustrated in FIG. 8 each include green phosphor particles 318, red phosphor particles 319, and LED chip 315 in which the light emission peak is at the wavelength of 450 nm. First white light source 311 and second white light source 312 are different in the amount of green phosphor particles 318 and/or red phosphor particles 319, and thus are different in the profile of the emission spectrum.

FIG. 9 illustrates the chromaticity and the FCIs of white light from first white light source 311 and second white light source 312 included in vehicle front lamp 100 according to the embodiment.

In recent years, the "feeling of contrast index" has been proposed as an index for evaluating how vivid the color of an illuminated object illuminated by a given light source appears (for example, see Handbook of Color Science, 3$^{rd}$ Edition, edited by The Color Science Association of Japan).

The feeling of contrast index (FCI) values are determined by Equation 1 below, and light having a high feeling of contrast index vividly renders the colors of the illuminated object, thereby increasing the feeling of contrast (vividness). Here, "feeling of contrast" indicates how clearly a visual object can be visually recognized in contrast to its surroundings. In other words, a high feeling of contrast indicates that the visual object is clearly visually recognizable in contrast to its surroundings.

It should be noted that in Equation 1, "$G_{LAB}(T)$" indicates the color gamut surface area determined by the LAB color system of a four color sample (red, blue, green, and yellow) illuminated by a test light source. Moreover, "$G_{LAB}(D65)$" indicates the color gamut surface area determined by the LAB color system of the same four color sample under reference light source D65 (6500 K daylight color temperature).

MATH. 1

$$FCI = \left[\frac{G_{LAB}(T)}{G_{LAB}(65)}\right]^{1.5} \times 100 \quad \text{Equation 1}$$

For example, in a comparison of how color is visualized, the feeling of contrast is equal when a vividly colored object is illuminated by 1000 lx light from a light source having an FCI of 150 and the same object is illuminated by 1500 lx light from a light source having an FCI of 100. In the present embodiment, the FCI is approximately at least 50 and at most 160.

As illustrated in FIG. 9, the chromaticity (x, y) of first white light L1 is (0.3461, 0.3548). Moreover, the chromaticity (x, y) of second white light L2 is (0.3461, 0.3548). In other words, the chromaticity of first white light L1 and the chromaticity of second white light L2 are the same.

Moreover, the FCI of first white light L1 is 90. Moreover, the FCI of second white light L2 is 110. In other words, the chromaticity of first white light L1 and the chromaticity of second white light L2 are the same, whereas the FCI of first white light L1 and the FCI of second white light L2 are different.

As described above, first white light L1 and second white light L2 are set so that their chromaticity are substantially the same, i.e., their chromaticity falls within the 5-step MacAdam ellipse on the xy chromaticity diagram of the CIE color system, and their FCIs are different by at least 10. In the present embodiment, the FCI of first white light L1 and the FCI of second white light L2 are different by 20. With this, humans feel that the color of first white light L1 and the color of second white light L2 are substantially the same, and also feel that the vividness of an illuminated object is different between when the object is illuminated by first white light L1 and when the same object is illuminated by second white light L2.

It should be noted that the FCI of first white light L1 and the FCI of second white light L2 are not particularly limited as long as their FCIs are different by at least 10. For example, the FCI of first white light L1 may be 150, and the FCI of second white light L2 may be 160. Alternatively, for example, the FCI of first white light L1 may be 70, and the FCI of second white light L2 may be 80. In any examples, by proving at least 10 differences between the FCI of first white light L1 and the FCI of second white light L2, humans can feel that the vividness is different between when an illuminated object is illuminated by first white light L1 and when the same object is illuminated by second white light L2.

Here, controller 104 temporally controls a light intensity ratio between first white light L1 and second white light L2.

Figure 10:
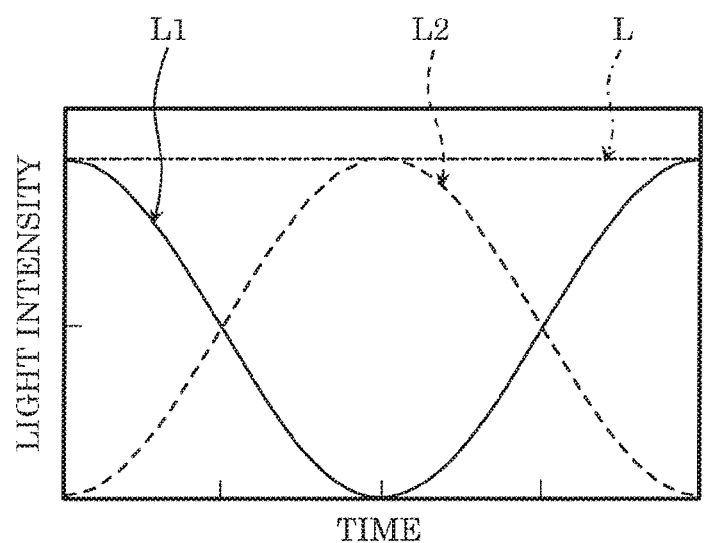
FIG. 10 illustrates an exemplary change in light intensity with respect to time for white light from a vehicle front lamp according to an embodiment.

FIG. 10 illustrates an exemplary change in light intensity with respect to time for white light from vehicle front lamp 100 according to the embodiment. It should be noted that FIG. 10 partially illustrates temporal changes in first white light L1, second white light L2, and illumination light L. In the graph of FIG. 10, the x axis denotes time. For example, a time period from 0 millisecond (ms) to 200 ms (50 ms per scale) is shown.

As illustrated in FIG. 10, a light intensity of first white light L1 changes over time. In other words, controller 104 controls first white light source 311 so that the light intensity of first white light L1 changes over time. In order to perform this control, for example, controller 104 temporally changes an amount of power injected into the light-emitting element included in first white light source 311. It should be noted that controller 104 may include a time counter (a clock) such as a real time clock (RTC) in order to measure time.

The light intensity of first white light L1 is periodically changed by controller 104 in the above-described manner. In the present embodiment, a frequency of light intensity which indicates a change in light intensity with respect to time of first white light L1 is 5 Hz.

Moreover, the light intensity of second white light L2 also changes over time. In other words, controller 104 controls second white light source 312 so that the light intensity of second white light L2 changes over time. In order to perform this control, for example, controller 104 temporally changes an amount of power injected into the light-emitting element included in second white light source 312.

The light intensity of second white light L2 is periodically changed by controller 104 in the above-described manner. In the present embodiment, the frequency of light intensity of second white light L2 is equal to the frequency of light intensity of first white light L1.

Moreover, controller 104 temporally controls a light intensity ratio between first white light L1 and second white light L2. More specifically, controller 104 controls first white light source 311 and second white light source 312 so that a light intensity ratio between first white light L1 and second white light L2 is temporally changed.

As illustrated in FIG. 10, for example, the time of maximizing the light intensity and the time of minimizing the light intensity are different between first white light L1 and second white light L2. Controller 104 controls first white light source 311 and second white light source 312 so that the light intensity of second white light L2 is minimized when the light intensity of first white light L1 is maximized, and the light intensity of second white light L2 is maximized when the light intensity of first white light L1 is minimized. In other words, controller 104 controls first white light source 311 and second white light source 312 so that first white light L1 and second white light L2 are in an inverse relationship with regard to the change in light intensity with respect to time. For example, in this manner, controller 104 temporally changes the light intensity ratio between first white light L1 and second white light L2.

Here, it is commonly known that humans visually perceive a difference in light when the above-mentioned frequency of light intensity is different (for example, see the homepage of Japan Electric Engineers' Association "http://www.jeea.or.jp/course/contents/08302/").

Figure 11:
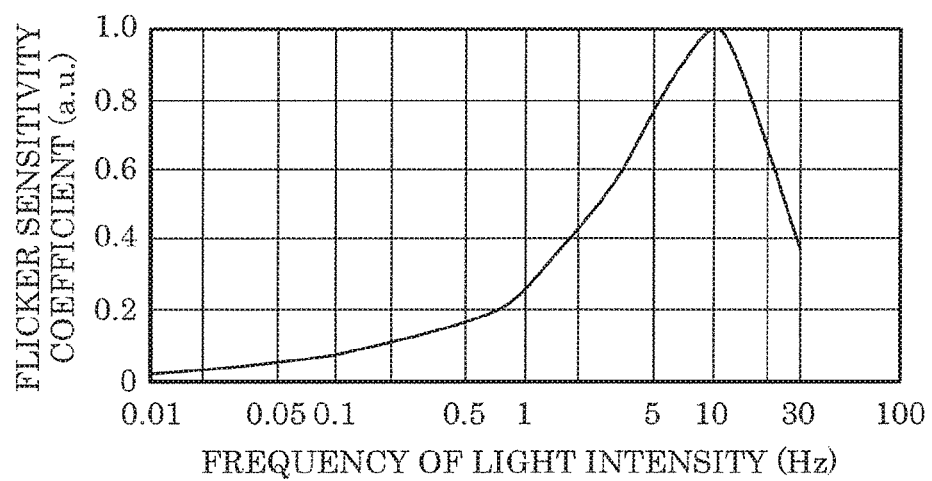
FIG. 11 illustrates a change in human visibility according to the change in light intensity with respect to time.

FIG. 11 illustrates a change in human visibility according to the change in light intensity with respect to time. More specifically, in the graph of FIG. 11, the x axis denotes the frequency of light intensity, and the y axis denotes the flicker sensitivity coefficient. Here, the flicker sensitivity coefficient is an index of whether humans are sensitive to flicker of light (light-dark change) when humans look at light having a certain frequency of light intensity. For example, many humans are more sensitive to the flicker with an increase in the flicker sensitivity coefficient, whereas many humans are less sensitive to the flicker with a decrease in the flicker sensitivity coefficient.

As illustrated in FIG. 11, the flicker sensitivity coefficient increases with an increase in the frequency of light intensity. Moreover, the flicker sensitivity coefficient is maximized when the frequency of light intensity is 10 Hz. In other words, the most humans are sensitive to the flicker when the frequency of light intensity is 10 Hz. Moreover, the flicker sensitivity coefficient decreases with an increase in the frequency of light intensity when the frequency of light intensity exceeds 10 Hz. It should be noted that although the flicker sensitivity coefficient for the frequency of light intensity above 30 Hz is not shown, many humans are not sensitive to light having a frequency of light intensity above 30 Hz. In view of the above, light having a frequency of light intensity within a predetermined range, for example, light having a frequency of light intensity in a range of from 1 Hz to 30 Hz, is perceived by humans as flickering.

Here, as described above, controller 104 controls first white light source 311 and second white light source 312 so that the light intensity of first white light L1 and the light intensity of second white light L2 are temporally changed. Moreover, the chromaticity of first white light L1 and the chromaticity of second white light L2 are each within the 5-step MacAdam ellipse on the xy chromaticity diagram of the CIE color system, and the FCI of first white light L1 and the FCI of second white light L2 are different by at least 10.

When such first white light L1 and second white light L2 are emitted onto a certain illuminated surface on which they overlap each other, humans visually recognize no change in chromaticity (color), but visually recognize a temporal change in the feeling of contrast of the illuminated surface. In other words, the vividness of the illuminated surface is perceived by humans as flickering.

More specifically, controller 104 controls the frequency of the light intensity of first white light L1 and the frequency of the light intensity of second white light L2 so as to be in a range from 1 Hz to 30 Hz inclusive, and temporally and periodically change the light intensity ratio between first white light L1 and second white light L2. With this, the FCI of illumination light L can temporally change according to the periodical change in the light intensity ratio between first white light L1 and second white light L2. For this reason, the vividness of the illuminated surface illuminated by illumination light L is perceived by humans as flickering. For example, when illumination light L from first light emitter 300 is emitted onto sign-post 202, drivers perceive the vividness of sign-post 202 as flickering.

It should be noted that although the frequency of light intensity of first white light L1 and the frequency of light intensity of second white light L2 may be in a range of from 1 Hz to 30 Hz, they may be in a range of from 5 Hz to 20 Hz. With this, the vividness of the illuminated objects such as sign-post 202 and pedestrian 203 illuminated by illumination light L can be perceived by humans as more flickering.

Moreover, as illustrated in FIG. 10, the total light intensity, which is a sum of the light intensity between first white light L1 and second white light L2, may be substantially constant. In other words, the light intensity of illumination light L may be substantially constant. With this, for drivers, a change in the vividness (change in FCI) of the illuminated objects illuminated by illumination light L can be enhanced since a reign illuminated by illumination light L has a uniform light intensity distribution.

It should be noted that how to change the light intensity with respect to time (a waveform) for first white light L1 and second white light L2 is not limited to a sine wave. For example, the waveform may be a square wave.

Moreover, for example, the light intensity with respect to time of first white light L1 is constant, and only the intensity of second white light L2 may be temporally changed. In other words, it is sufficient so long as the light intensity ratio between first white light L1 and second white light L2 which are included in illumination light L is temporally changed. With this, the vividness of the illuminated objects such as sign-post 202 illuminated by illumination light L can be perceived by drivers as flickering since the FCI of illumination light L is temporally changed.

Effects

As described above, vehicle front lamp 100 according to the embodiment is for use in vehicle 400 and includes: first white light source 311 that emits first white light L1; and second white light source 312 that emits second white light L2 having a feeling of contrast index that is different from a feeling of contrast index of first white light L1 by at least 10. Moreover, vehicle front lamp 100 further includes controller 104 that controls light intensity of first white light L1 and light intensity of second white light L2. The chromaticity of first white light L1 and the chromaticity of second white light L2 are each within a 5-step MacAdam ellipse. Moreover, first white light source 311 and second white light source 312 are disposed in vehicle front lamp 100 so that first white light L1 and second white light L2 overlap each other on a certain illuminated surface. Moreover, controller 104 temporally changes a light intensity ratio between first white light L1 and second white light L2.

With this configuration, the light intensity ratio between first white light L1 and second white light L2 is temporally changed, and thus the FCI of illumination light L is temporally changed. In this manner, the vividness of the illuminated objects such as sign-post 202 and pedestrian 203 illuminated by illumination light L is perceived differently over time. Accordingly, it is possible to improve driver visibility of information indicated by sign-post 202 on road 200, etc. illuminated by illumination light L.

Moreover, with vehicle front lamp 100, the colors of first white light L1 and second white light L2 included in illumination light L are visually perceived as almost the same since their chromaticity falls within the 5-step MacAdam ellipse. In other words, the entire region illuminated by illumination light L is visually perceived by humans as almost the same light color. Accordingly, for people who are present in an area illuminated by illumination light L such as pedestrian 203 and oncoming drivers, the non-uniformity of color is rarely perceived in illumination light L. Moreover, for drivers, the entire region illuminated by illumination light L is visually perceived as almost the same light color regardless of visual perception in different bright ambient environments (in photopic vision, in scotopic vision, and in mesopic vision), and in central vision and in peripheral vision.

Accordingly, this configuration can suppress a strange feeling evoked by color of illumination light L.

In view of the foregoing, vehicle front lamp 100 can suppress the strange feeling evoked by color of illuminating light and improve the visibility.

Moreover, controller 104 may temporally change the light intensity ratio so that a sum of the light intensity of first white light L1 and the light intensity of second white light L2 is substantially constant.

With this, the light intensity of illumination light L is substantially constant. Accordingly, for drivers, the visibility of an illuminated object can be improved since a change in vividness (a change in FCI) of the illuminated object illuminated by illumination light L is enhanced by keeping the light intensity constant. Moreover, for people who are present in an area illuminated by illumination light L such as pedestrian 203 and oncoming drivers, a strange feeling or an uncomfortable feeling evoked by light-dark fluctuation of illumination light L is suppressed since the light intensity of illumination light L, is not changed over time.

Moreover, first white light source 311 and second white light source 312 are disposed in vehicle front lamp 100 so that first white light L1 and second white light L2 are emitted far ahead.

Sign-post 202 and pedestrian 203 which drivers need to visually recognize are mostly located above the surface of road 200. Accordingly, illumination light L may be emitted far ahead of a vehicle. For example, illumination light L may be emitted far ahead of vehicle 400 in which there is a large amount of information such as sign-post 202 and pedestrian 203 and thus a good visibility is required, and light having temporally-unchanged light intensity may be emitted from second light emitter 301 onto the surface of a load in which, in comparison with the far ahead of vehicle 400, there is a smaller amount of information such as white lines 201 and thus the good visibility is not required. This can reduce the number of light sources controlled by controller 104 so as to temporally change the light intensity, thereby simplifying the configuration of vehicle front lamp 100 (the operation of controller 104). In other words, with this configuration, it is possible to simplify the configuration of vehicle front lamp 100, suppress a strange feeling evoked by color of illuminating light, and improve the visibility.

Moreover, controller 104 may control a frequency of the light intensity of first white light L1 and a frequency of the light intensity of second white light L2 so as to be in a range from 1 Hz to 30 Hz inclusive, the frequency of the light intensity indicating a temporal change in the light intensity.

With this, drivers perceive the vividness of illuminated objects illuminated by illumination light L as more flickering. Accordingly, with this configuration, driver visibility can be further improved.

Other Embodiments

Hereinbefore, the vehicle front lamp according to the embodiment was described, but the present disclosure is not limited to the above embodiment.

In the above embodiment, the configuration of the vehicle front lamp illustrated in FIG. 2 is merely one non-limiting example. As illustrated in FIG. 4, the vehicle front lamp may merely be configured so as to emit light having the above-described properties regarding the road surface side and the far ahead side (sign-posts on the road, etc.). The vehicle front lamp may include, for example, a mirror to adjust the emission direction of the light. Moreover, the vehicle front lamp illustrated in FIG. 2 is configured so as to include two or more first light emitters and two or more second light emitters, but the configuration of the vehicle front lamp is not limited to this example. The vehicle front lamp may include one first light emitter and one second light emitter. Moreover, the number of the first light emitters and the number of the second light emitters may be the same or different.

Moreover, in the above embodiment, the first white light source and the second white light source are disposed in the housing of the first light emitter, but the configuration is not limited to this example. The first white light source and the second white light source may be provided separately in different housings.

Moreover, in the above embodiment, two types of phosphors are used to achieve the above-described emission spectrum using a single LED chip (light-emitting element), but this method is merely one example. For example, any phosphor and/or light-emitting element may be used so long as the above conditions are satisfied.

For example, in the example according to the above embodiment, an LED chip is given as one specific example of the light-emitting element, but a semiconductor light-emitting element such as a semiconductor laser, or a solid state light-emitting element such as an organic or inorganic electroluminescent (EL) element may be used as the light-emitting element. Moreover, for example, the white light source may include three or more types of phosphors that have different central fluorescent wavelengths. In either case, so long as the above emission spectrum conditions are satisfied, the vehicle front lamp can emit white light that suppresses a strange feeling evoked by color of illuminating light and improves the visibility.

Moreover, for example, in the above embodiment, the white light source is exemplified as being realized as an SMD light-emitting module, but the white light source according to the present disclosure may be realized as a chip-on-board (COB) LED module in which an LED chip is mounted directly onto the substrate.

Moreover, the white light source according to the present disclosure may be realized as a remote phosphor light-emitting element on which a resin material including phosphor is disposed in a position separated from the LED chip.

Moreover, the first light emitter and the second light emitter according to the present disclosure may be realized as remote phosphor emitters on which a resin material including phosphor is disposed in a position separated from the LED chip. For example, the first light emitter and the second light emitter may be formed by bifurcating light emitted from a single light source using, for example, a light waveguide or optical fiber. In such cases, the first light emitter and the second light emitter may include a wavelength converter containing phosphor to convert the wavelength of the light from the single light source so as to achieve the properties described above.

Moreover, for example, typical automobiles are equipped with vehicle front lamps that can switch between emitting low and high beams. The light emitted by the vehicle front lamp according to the present disclosure may be applied to low beam light and may be applied to high beam light.

Moreover, the vehicle front lamp according to the present disclosure is not limited to any particular shape, structure, and/or size; the vehicle front lamp according to the present disclosure is sufficient so long as it satisfies conditions regarding the light properties described in the above embodiment.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A vehicle front lamp for use in a vehicle, the vehicle front lamp comprising:
    a first white light source that emits first white light;
    a second white light source that emits second white light having a feeling of contrast index that is different from a feeling of contrast index of the first white light by at least 10; and
    a controller that controls light intensity of the first white light and light intensity of the second white light,
    wherein chromaticity of the first white light and chromaticity of the second white light are each within a 5-step MacAdam ellipse,
    the first white light source and the second white light source are disposed in the vehicle front lamp so that the first white light and the second white light overlap each other on a certain illuminated surface, and
    the controller temporally changes a light intensity ratio between the first white light and the second white light.

2. The vehicle front lamp according to claim 1, wherein the controller temporally changes the light intensity ratio so that a sum of the light intensity of the first white light and the light intensity of the second white light is substantially constant.

3. The vehicle front lamp according to claim 1, wherein the first white light source and the second white light source are disposed in the vehicle front lamp so that the first white light and the second white light are emitted far ahead.

4. The vehicle front lamp according to claim 1, wherein the controller controls a frequency of the light intensity of the first white light and a frequency of the light intensity of the second white light so as to be in a range from 1 Hz to 30 Hz inclusive, the frequency of the light intensity indicating a temporal change in the light intensity.

5. The vehicle front lamp according to claim 1, further comprising:
    a light emitter disposed in the vehicle front lamp so as to emit third white light downward ahead, the third white light being light having chromaticity within the 5-step MacAdam ellipse for the chromaticity of the first white light and the chromaticity of the second white light.

6. The vehicle front lamp according to claim 1, further comprising
    a beam splitter that aligns an optical axis of the first white light and an optical axis of the second white light.

7. The vehicle front lamp according to claim 1, wherein at least one of the first white light source and the second white light source includes: a light-emitting element; and a phosphor that is excited by light from the light-emitting element and emits light having a wavelength different from a wavelength of the light from the light-emitting element.

8. The vehicle front lamp according to claim 7, wherein the light-emitting element emits blue light, and
the phosphor includes: a green phosphor that is excited by the blue light from the light-emitting element and emits green light; and a red phosphor that is excited by the blue light from the light-emitting element and emits red light.

* * * * *